United States Patent [19]

Dory

[11] Patent Number: 4,877,641
[45] Date of Patent: Oct. 31, 1989

[54] PROCESS FOR PLASMA DEPOSITING SILICON NITRIDE AND SILICON DIOXIDE FILMS ONTO A SUBSTRATE

[75] Inventor: Thomas S. Dory, New Haven, Conn.

[73] Assignee: Olin Corporation, Cheshire, Conn.

[21] Appl. No.: 200,202

[22] Filed: May 31, 1988

[51] Int. Cl.$^4$ ............... B05D 3/02; B05D 3/06; C23C 16/30
[52] U.S. Cl. ................... 427/38; 427/45.1; 427/255; 427/255.2; 427/255.3; 437/238; 437/241; 437/243
[58] Field of Search ............. 427/38, 45.1, 255, 255.2, 427/255.3; 437/238, 241, 243

[56] References Cited

U.S. PATENT DOCUMENTS

| | | | |
|---|---|---|---|
| 3,540,926 | 11/1970 | Rairden, III | 117/217 |
| 4,142,004 | 2/1979 | Hauser, Jr. et al. | 427/39 |
| 4,279,947 | 7/1981 | Goldman et al. | 427/255.2 |
| 4,500,483 | 2/1985 | Veltri et al. | 264/81 |
| 4,657,777 | 4/1987 | Hirooka et al. | 427/39 |
| 4,681,653 | 7/1987 | Purdes et al. | 156/614 |
| 4,696,834 | 9/1987 | Varaprath | 437/223 |
| 4,699,825 | 10/1987 | Sakai et al. | 428/337 |
| 4,720,395 | 1/1988 | Foster | 437/241 |

OTHER PUBLICATIONS

Chemical Abstracts, vol. 98, 126375t.
Chemical Abstracts, vol. 101, 91218.
Watanabe et al., "Properties of Silicon Nitride Films Prepared by Plasma-Enhanced Chemical Vapor Deposition of $SiH_4$–$N_2$ Mixtures" Thin Solid Films, 136, pp. 77–83 (1986).
Watanabe et al., "A Simple and Convenient Method for Preparing Di-t-Butylsilanes", Chemistry Letters, pp. 1321–1322 (1981).
K. Triplett et al., "Synthesis and Reactivity of Some t-butyl-disilanes and digermanes".
Doyle et al., "Hindered Organosilicon Compounds Synthesis and Properties of Di-tert-butyl, Di-tert-butylmethyl- and Tri-tert-butylsilanes" J. American Chemical Society, 97, pp. 3777–3782 (1975).

Primary Examiner—Sadie Childs
Attorney, Agent, or Firm—William A. Simons

[57] ABSTRACT

A plasma CVD process for forming silicon nitride-type or silicon dioxide-type films onto a substrate comprising the steps of:
(a) introducing di-tert-butylsilane and at least one other reactant gas into a CVD reaction zone containing said substrate on which either a silicon nitride-type or silicon dioxide-type film is to be formed;
(b) maintaining the temperature of said zone and said substrate from about 100° C. to about 350° C.;
(c) maintaining the pressure in said zone from about 0.1 to about 5 Torr; and
(d) passing said gas mixture into contact with said substrate while exciting said gas mixture with a plasma for a period of time sufficient to form a silicon nitride-type or silicon dioxide-type film on said substrate, wherein said plasma is excited by a RF power at about 10 to 500 Watts.

24 Claims, No Drawings

PROCESS FOR PLASMA DEPOSITING SILICON NITRIDE AND SILICON DIOXIDE FILMS ONTO A SUBSTRATE

CROSS-REFERENCE TO RELATED PATENT APPLICATIONS

This application is related to U.S. patent application Ser. No. 07/200,203 entitled "Process For Thermally Depositing Silicon Nitride And Silicon Dioxide Films Onto A Substrate", filed in the name of the same inventor simultaneously with this patent application.

BACKGROUND OF THE INVENTION

1. Field of the Invention

The present invention relates to a process for plasma depositing silicon nitride or silicon dioxide films onto a substrate. In particular, the present invention relates to a process for plasma depositing silicon nitride or silicon dioxide films onto a substrate wherein di-tert-butylsilane is employed as a silicon source for these films.

2. Brief Description of the Prior Art

Chemical vapor deposition (CVD) is used throughout the microelectronics industry for semiconducting and insulating thin film deposition. When films such as silicon nitride ($Si_3N_4$) or silicon dioxide ($SiO_2$) are deposited, silane ($SiH_4$) is generally used as the gaseous silicon source.

Silicon nitride and dioxide, important materials in the production of integrated circuits, are used as gate dielectrics, diffusion masks, and passivation films. Silicon nitride has a high dielectric strength, excellent barrier properties against impurity diffusion, and good chemical stability. Silicon dioxide has good insulating properties and is chemically stable for these applications.

Silane is highly toxic and spontaneously flammable in air. It requires the use of expensive gas cabinets and a cross purging gas supply system. Special purging procedures are needed before introduction into deposition equipment. A number of silicon containing chemicals have been used or proposed as silicon sources for nitride and oxide CVD. These include silicon tetrachloride ($SiCl_4$), silicon tetrabromide ($SiBr_4$), silicon tetrafluoride ($SiF_4$), dichlorosilane ($SiH_2Cl_2$), and disilane ($Si_2H_6$). Other chemicals such as tetramethylorthosilicate [TMOS $Si(OCH_3)_4$], tetraethylorthosilicate [TEOS, $Si(OC_2H_5)_4$] and tetramethylcyclotetrasiloxane (TMCTS, $C_4H_{16}Si_4O_2$) could be used only for oxide deposition. All of the above halogen containing silanes are toxic and corrosive themselves in addition to producing toxic and corrosive by-products. Disilane is a flammable, toxic gas that requires similar handling procedures to silane. Presently, if a microelectronics manufacturer wants to limit its use of silane, TMOS, TMCTS and TEOS are the only commercially feasible alternatives for silicon dioxide deposition. There are no commercially feasible alternatives to silane for silicon nitride deposition.

Accordingly, there is a need for better alternatives to silane in these CVD processes. The present invention is a solution to that need.

Separately, di-tert-butylsilane (DTBS) is a known chemical with a Chemical Abstracts registry number [30736-07-3]. Processes for making DTBS are disclosed by Watanabe et al "A Simple and Convenient Method for Preparing Di-t-Butyl Silanes", *Chemistry Letters* pp. 1321-1322, 1981; Doyle et al "Hindered Organosilicon Compounds. Synthesis and Properties of Di-tert-butyl-, Di-tert-butylmethyl-, and Tri-tert-butylsilanes", *J. Am. Chem. Soc.*, 97, pp. 3777-3782 (1975) and Triplett et al, "Synthesis and Reactivity of Some t-Butyl-Disilanes and Digermanes", *Journal of Organometallic Chemistry*, Vol. 107, pp. 23-32 (1976). All three of these articles are incorporated herein by reference in their entireties. DTBS has been used as a silylation agent to hydroxy compounds (CA 101: 91218v) and as an intermediate in the production of di-tert-butyldichlorosilane (CA 98: 126375t).

Di-tert-butylsilane is an air-stable, non-corrosive liquid. It is soluble in many organic solvents and does not react with water. Its high vapor pressure at room temperature allows for easy introduction into CVD reactors. No gas cabinets or cross purging systems are needed in order to use this chemical in CVD reactors. The decomposition by-products are not corrosive in nature. Thus, according to the present invention, di-tert-butylsilane represents a silicon source that may be used for both nitride and oxide deposition.

BRIEF SUMMARY OF THE INVENTION

Accordingly, the present invention is directed to a plasma CVD process for forming silicon nitride-type or silicon dioxide-type films onto a substrate comprising the steps of:
(a) introducing di-tert-butylsilane and at least one other reactant gas into a CVD reaction zone containing said substrate on which either a silicon nitride-type or silicon dioxide-type film is to be formed;
(b) maintaining the temperature of said zone and said substrate from about 100° C. to about 350° C.;
(c) maintaining the pressure in said zone from about 0.1 to about 5 Torr; and
(d) passing said gas mixture over said substrate while exciting said gas mixture with a plasma for a period of time sufficient to form a silicon nitride-type or silicon dioxide-type film thereon, wherein said plasma is excited by a RF power of about 10 to about 500 Watts.

DETAILED DESCRIPTION

The CVD process of this invention may be used to produce silicon nitride-type or $Si_3N_4$-type films having an optimum refractive index ($N_f$) in the range of about $2.0\pm0.2$. The lower the refractive index in this range, the higher the N percentage, and the higher the refractive index in this range, the higher the Si percentage. The terms "silicon nitride-type films" and "$Si_3N_4$-type films" as used herein mean films formed with a refractive index in the above optimum range.

The CVD process of this invention may also be used to produce silicon dioxide-type or $SiO_2$ films having an optimum refractive index ($N_f$) in the range of about $1.46\pm0.2$. The lower the refractive index in this range, the higher the 0 percentage, and the higher the refractive index in this range, the higher the Si percentage. The terms "silicon dioxide-type films" and "$SiO_2$-type films" as used herein mean films formed with a refractive index in the above optimum range.

Substrates may be any material on which a silicon nitride, silicon dioxide-type film is desired, e.g. Si wafers, glass or metal objects or films; GaAs layers; or any semiconductor layer or device employing Groups III to V elements or compounds, such as NMOS system gates in integrated circuit technology. The substrate is heated to the reaction temperature by a resistance element in a reaction chamber into which the gases are introduced or by induction heating.

While not critical, it is preferred to maintain the reaction chamber isothermal, by which is meant having temperature variations throughout of less than 2° C., preferably ±1° C. The reactant gases are input at ambient temperature a sufficient distance from the wafers to be coated to permit the gases to reach a reaction temperature of about 100° C. to about 350° C. at the point where the plasma is struck. Compared to the wafer mass, the gases, at ambient temperature will not appreciably cool the wafer.

The gases may be introduced into the reaction chamber by separate inlet lines, or they may be premixed in a mixing manifold. The reaction gases are introduced in a substantially laminar flow over the substrate surface. The residence time over the substrate is kept short to eliminate substantial concentration variations over the wafer. The substrate, typically a Si wafer, is preferably confined in a manner so as to provide reaction chamber wall to wafer edge spacing, and wafer to adjacent wafer spacing, such that the silicon nitride-type or silico dioxide-type films produced by the process of this invention are substantially uniform across the wafer surface, i.e., do not exhibit substantial concavity (edge build-up) or convexity (center mounding). Film uniformity obtained preferably exhibits less than ±3% thickness variation, both within (across) the wafers, and from wafer to wafer in a batch or production run.

Typical gas flow rates may be on the order of from about 50 to about 300 standard cc/min. (sccm) for the DTBS (preferably about 75-200 sccm), and from about 2 standard cc/min. to 4000 standard cubic centimeters per minute for the other reactant gas or gases capable of reacting with DTBS to form silicon nitride (e.g. anhydrous ammonia, $N_2$, or hydrazine) or silicon dioxide (e.g. nitrous oxide or nitric oxide or mixtures thereof). The preferred gas flow rate ranges are about 200-700 sccm for $N_2$, about 2 to about 3000 sccm for anhydrous ammonia, about 200-4000 sccm for nitrous oxide, and about 0-4000 sccm for nitric oxide. The most preferred flow rate range of nitrous oxide is from about 300 to about 3000 sccm. The most preferred nitric oxide flow rate is 0 to about 2000 sccm. Setting the reaction chamber pressure and the flow rate of either reactant permits control of film properties, as expressed by the refractive index ($N_f$). Thus, for a given pressure and DTBS flow rate, increasing or decreasing the $NH_3$, $N_2$, $N_2O$ or NO flow rate changes the $N_f$ of the film. The reaction chamber pressures are controlled in the range of from about 0.1 Torr. to about 5 Torr. for both types of depositions. The preferred range being from about 0.2 to about 4 Torr. for both dioxide and nitride formation. As mentioned above, the reaction temperatures for these type of plasma depositions are from about 100° to 350° C. The preferred temperature range for both dioxide and nitride deposition is about 125° C. to about 325° C., more preferably from about 200° C. to about 300° C.

The plasma is struck (started up) by means of a radio frequency (RF) generator and electrode in the CVD reactor zone. There are two widely used RF generators in the plasma CVD area today. One is capable of generating a plasma at 13.56 MHz at a power of about 10 to about 200 Watts, preferably from about 12 to 75 Watts. The second widely used plasma-generating frequency is 50 KHz at a power of about 100 to about 500 Watts, preferably about 150 to about 400 Watts. However, the broadest aspects of the present invention is not to be limited to just these two frequencies. The most preferred flow rate of anhydrous ammonia with the 13.56 MHz generator is from about 2 to 20 sccm. The most preferred flow rate of $N_2$ with the 13.56 MHz generator was about 200 to about 700 sccm. With the 50 KHz generator, the most preferred flow rate of $NH_3$ was about 1500 to about 2500 sccm and the gases are pumped through the CVD reaction zone at a most preferred rate to sustain a pressure in the range from about 1.0 Torr. to about 3.0 Torr.

To begin deposition, DTBS, ammonia and $N_2$ where silicon nitride-type films is desired or nitrous oxide ($N_2O$) or a mixture of nitrous oxide and nitric acid (NO) in the case of where a silicon dioxide-type film is desired are introduced through an inlet (possibly together with a diluent such as Helium or Argon) in the CVD reaction zone and passed through the plasma produced by the RF generator and passed over the substrate. The plasma quickly forms either a silicon nitride-type film or silicon dioxide-type film on the substrate.

The film formation rate is typically in the range of from about 10 to about 500 Angstroms/minute with typical operating rates being on the order of from about 30-300 Å/min., with the optimum being about 100-200 Å/min. at a pressure of about 0.2-4.0 Torr. at about 200°-300° C. Thus, this control of the relative flow rates of the reactants and the pressure permits precise control of film properties. Further, the low temperature of reaction provides a growth rate sufficiently moderate to be controllable yet sufficiently high to be suitable for commercial production.

The following examples further illustrate the present invention. All parts and percentages are by weight unless explicitly stated otherwise.

EXAMPLE 1

Preparation of Di-tert-butylsilane (DTBS)

Tert-butyllithium, $(CH_3)_3CLi$, [1.12 liters, (1.9 moles)] in pentane was added to a 2 liter flask containing hexane (about 200 ml) under a nitrogen atmosphere at room temperature. The flask was then cooled to −5° C. Dichlorosilane, $Cl_2SiH_2$, [65.53 g (1.0 mole)] was slowly added to the mixture in the cooled flask by means of cold finger. An immediate exothermic reaction and a white solid precipitate occurred.

Subsequent to addition, the mixture was stirred for two hours at −5° C. and then for two hours at room temperature. The white solid, lithium chloride, by-product was then removed by filtration and washed three times with pentane. The washings were combined with the filtrate. The combined filtrate and washings were then fractional distilled (pentane and hexane removed at about 70° C. and the desired product DTBS at about 126° C. to recover the DTBS in about a 90% yield.

The recovered product was identified as di-tert-butylsilane by proton NMR and infrared spectroscopy.

EXAMPLE 2

Alternative Preparation of Di-tert-butylsilane (DTBS)

Tert-butyllithium, $(CH_3)_3CLi$ [0.30 liters, (0.51 moles)] in pentane was added to an empty 500 milliliter flask under a nitrogen atmosphere at 0° C. Tetrachlorosilane, $SiCl_4$, [42.5 g (0.25 moles)] was then added to the cooled flask. The mixture was stirred for 30 minutes at 0° C. No immediate reaction was observed. Next, the reaction mixture was stirred for 12 hours at room temperature. A white solid precipitate was then observed. Next, the majority of the pentane was removed by vacuum distillation and then replaced with 300 ml of heptane. This new reaction mixture was heated to reflux for a 48 hour duration. After this time, the cooled solution was combined with lithium aluminium hydride, $LiAlH_4$, [9.5 g (0.25 moles)] while maintaining the nitrogen atmosphere. This reaction solution was heated at reflux for 5 hours, then cooled to room temperature and the reaction mixture filtered to remove by-product salts. The resulting filtrate was slowly poured onto ice and a two phase solution resulted. The organic phase was separated from the aqueous phase and then dried using magnesium sulfate. The dried organic phase was then fractional distilled (heptane removed at 98° C. and the desired product DTBS at about 126° C.) to recover the DTBS in about an 80% yield.

The recovered product was identified as di-tert-butylsilane by proton NMR and infrared spectroscopy.

EXAMPLE 3

Plasma Deposition of Silicon Dioxide ($SiO_2$) Employing DTBS as a Reactant

For this and the following Example, a Plasma-Therm 530/530 duel deposition parallel plate reactor (manufactured by Plasma-Therm Inc. of Kresson, N.J.) was employed. A vacuum pumping system and gas supply system were attached to the reactor and four silicon wafers (4" diameter) were placed horizontally on the bottom electrode of the reactor.

After wafer loading, the bottom electrode of the reactor was heated to 300° C. Next, the reactor was evacuated to a base pressure of 0.020 Torr.

Nitrous oxide ($N_2O$) at a flow rate of 650 sccm was introduced in the reactor. A continuous plasma was struck using 13.56 MHz frequency at 15 Watts. DTBS vapor was introduced into the reactor at a flow rate of 192 sccm. The DTBS was vaporized before introduction by slightly warming (about 30° C.) under a vacuum.

Reaction and decomposition of the two gases formed silicon dioxide ($SiO_2$) films on the surfaces of the silicon wafers in the reactor. The deposition pressure was controlled at 0.200 Torr. After 10 minutes, the plasma was turned off and the gas mixture shut off. Nitrogen gas was introduced to purge the system. Then, the system is vented and the silicon wafers removed.

The silicon dioxide films on the silicon wafers were examined. The average silicon dioxide film thickness was 1344 Angstroms as determined by means of an ellipisometer. The average refractive index was 1.496 as determined by the ellipisometer.

These results indicate that good silicon dioxide films were deposited on the silicon wafers.

EXAMPLE 4

Plasma Deposition of Silicon Nitride ($Si_3N_4$) Employing DTBS As A Reactant

Using the same equipment as in Example 3, the reactor was heated to 300° C. after addition of four silicon wafers (4 inch diameter). Next the reactor was evacuated to a base pressure of 0.020 Torr.

Nitrogen was introduced at a flow rate of 650 sccm and then a plasma struck at 13.56 MHz frequency and 17 Watts. Anhydrous ammonia vapor was introduced at a flow rate of 5.0 sccm. Next, DTBS vapor was introduced at a flow rate of 192 sccm. The DTBS was vaporized before introduction by slightly warming (about 30° C.) under vacuum.

Reaction and decomposition of the three gases formed silicon nitride films on the surfaces of the silicon wafers in the reactor. The deposition pressure was controlled at 2.0 Torr in the reactor. After 5 minutes, the plasma was turned off and the ammonia and DTBS vapors were turned off. The nitrogen gas remained flowing to purge the system. Then the system was vented and the silicon wafers removed.

The silicon nitride films on the silicon wafers were examined. The average silicon nitride film thickness was 1990 Angstroms as determined by means of an ellipisometer. The average refractive index was 1.90 as determined by the ellipisometer.

This data indicated that good silicon nitride films were deposited on the silicon wafers.

EXAMPLE 5

Plasma Deposition of Silicon Dioxide ($SiO_2$) Employing DTBS As A Reactant

For this and the following Example, an ASM America pulsed plasma chemical vapor deposition system (manufactured by ASM America, Inc. of Phoenix, Ariz.) was employed. A vacuum pumping system and gas supply system were attached to the reactor. The plasma reactor contained 78 silicon wafers (4" diameter) held in a vertical position.

After wafer loading, the electrodes and wafers were heated to 300° C. Next, the reactor was evacuated to a base pressure of 0.050 Torr.

Nitrous oxide ($N_2O$) at a flow of 3000 sccm was introduced into the reactor with nitric oxide (NO) at a flow of 1500 sccm. DTBS vapor was introduced into the reactor at a flow of 74 sccm and a pulsed plasma struck using 50 KHz frequency at an average of 101 Watts. The power pulse sequence was alternating 20 milliseconds on followed by 250 milliseconds off. The DTBS was vaporized before introduction by slightly warming (about 30° C.) under vacuum.

Reaction and decomposition of the three gases formed silicon dioxide ($SiO_2$) films on the surfaces of the silicon wafers in the reactor. The deposition pressure was controlled at 1.24 Torr. After 5 minutes, the plasma was turned off and the gas mixture shut off. Nitrogen gas was introduced to purge the system. The system was then vented and the silicon wafers removed.

The silicon dioxide films on the silicon wafers were examined. The average silicon dioxide film thickness was 1055 Angstroms as determined by means of an ellipisometer. The average refractive index was 1.50 as determined by the ellipisometer. A sputtered AUGER profile indicated the film was $SiO_2$ containing less than 4 atomic percent carbon in the film.

These results indicate that good silicon dioxide films were deposited on the silicon wafers.

EXAMPLE 6

Plasma Deposition of Silicon Nitride ($Si_3N_4$) Employing DTBS As A Reactant

Using the same equipment as in Example 5, the reactor was heated to 300° C. after addition of 78 silicon wafers (4" diameter). Next the reactor was evacuated to a base pressure of 0.050 Torr.

Anhydrous ammonia gas was introduced at a flow rate of 2300 sccm. Next, DTBS vapor was introduced at a flow rate of 160 sccm and a pulsed plasma struck at 50

KHz frequency and an average power of 391 Watts. The power pulse sequence was alternating 70 milliseconds on followed by 160 milliseconds off. The DTBS was vaporized before introduction by slightly warming (about 30° C.) under vacuum.

Reaction and decomposition of the two gases formed silicon nitride (Si3N4) films on the surfaces of the silicon wafers in the reactor. The deposition pressure was controlled at 2.0 Torr. After 2.5 minutes, the plasma was turned off and gases turned off. Nitrogen gas was introduced to purge the system. The system was then vented and the silicon wafers removed.

The silicon nitride films on the silicon wafers were examined. The average silicon nitride film thickness was 450 Angstroms as determined by means of an ellipisometer. The average refractive index was 1.89 as determined by the ellipisometer.

This data indicated that good silicon nitride films were deposited on the silicon wafers.

What is claimed is:

1. A plasma CVD process for forming silicon nitride film having a refractive index from about 2.0±0.2 or silicon dioxide film having a refractive index from about 1.46±0.2 a substrate comprising the steps of:
   (a) introducing di-tert-butylsilane and at least one other reactant gas capable of reacting with said di-tert-butylsilane to form either silicon nitride or silicon dioxide into a CVD reaction zone containing said substrate on which either a silicon nitride or silicon dioxide film is to be formed;
   (b) maintaining the temperature of said zone and said substrate from about 100° C. to about 350° C.;
   (c) maintaining the pressure in said zone from about 0.1 to about 5 Torr; and
   (d) passing said gas mixture into contact with said substrate while exciting said gas mixture with a plasma for a period of time sufficient to form a silicon from about 2.0 ±0.2 or silicon dioxide film having a refractive index from about 1.46 ±0.2 on said nitride film having a refractive index substrate, wherein said plasma is excited by a RF power at about 10 to 500 Watts.

2. The plasma CVD process of claim 1 wherein a silicon nitride film is formed and said other gas is anhydrous ammonia.

3. The plasma CVD process of claim 2 wherein the plasma is formed at 50 KHz frequency and at a power of about 100 to about 500 Watts.

4. The plasma CVD process of claim 3 wherein the flow rate of said di-tert-butylsilane into said zone is from about 50 sccm to about 300 sccm and the flow rate into said zone of said anhydrous ammonia is from about 1000 sccm to about 3000 sccm.

5. The plasma CVD process of claim 1 wherein a silicon nitride film is formed and said other gases are a mixture of nitrogen and anhydrous ammonia.

6. The plasma CVD process of claim 5 wherein the plasma is formed at 13.56 MHz frequency at about 10 to about 100 Watts.

7. The plasma CVD process of claim 6 wherein the flow rate of said di-tert-butylsilane into said zone is from about 50 sccm to about 300 sccm, the flow rate of said nitrogen into said zone is from about 200 sccm to about 700 sccm, and the flow rate of said anhydrous ammonia into said zone is from about 2 sccm to about 20 sccm.

8. The plasma CVD process of claim 1 wherein said zone temperature and said substrate temperature are from about 125° C. to about 325° C.

9. The plasma CVD process of claim 1 wherein silicon dioxide film is formed and said other gas is nitrous oxide or a mixture of nitrous oxide and nitric oxide, wherein the flow rate of said di-tert-butylsilane is from about 50 sccm to about 300 sccm, the flow rate of nitrous oxide into said zone is from about 200 sccm to about 4000 sccm and the flow rate of nitric oxide is from 0 to about 4000 sccm.

10. The plasma CVD process of claim 9 wherein said plasma is formed at 50 KHz at about 100 to about 500 Watts.

11. The plasma CVD process of claim 9 wherein the plasma is formed at 13.56 MHz at about 10 to about 100 Watts.

12. The plasma CVD process of claim 1 wherein said zone pressure is from about 0.2 Torr. to about 4 Torr.

13. The plasma CVD process of claim 1 wherein said film formation rate is maintained at a rate from about 10 to about 500 Angstroms/minute.

14. A plasma CVD process for forming silicon nitride film having a refractive index from about 2.0±0.2 onto a substrate comprising the steps of:
   (a) introducing di-tert-butylsilane and at least one other reactant gas capable of reacting with said di-tert-butylsilane to form silicon nitride into a CVD reaction zone containing said substrate on which said silicon nitride film is to be formed;
   (b) maintaining the temperature of said zone and said substrate from about 125° C. to about 325° C.;
   (c) maintaining the pressure in said zone in the range from about 0.2 to about 4 Torr.; and
   (d) maintaining said gas mixture into contact with said substrate while exciting said gas mixture with a plasma for a period of time sufficient to form a silicon nitride film thereon having a refractive index of about 2.0±0.2, wherein said plasma is excited by a RF frequency of 50 KHz at about 100 to about 500 Watts or by a RF frequency of 13.56 MHz at about 10 to about 100 Watts.

15. The plasma CVD process of claim 14 wherein said other reactant gas is anhydrous ammonia.

16. The plasma CVD process of claim 15 wherein said plasma was struck at a frequency of 50 KHz and the flow rate of said di-tert-butylsilane into said zone is from about 75 sccm to about 200 sccm and the flow rate of said anhydrous ammonia is from about 1500 sccm to about 2500 sccm.

17. The plasma CVD process of claim 16 wherein said zone temperature and said substrate temperature are from about 200° C. to about 300° C. and said zone pressure is from about 1 Torr. to about 3 Torr.

18. A plasma CVD process for forming silicon dioxide film having a refractive index of about 1.46 ±0.2 onto a substrate comprising the steps of:
   (a) introducing di-tert-butylsilane and at least one other reactant gas capable of reacting with said di-tert-butylsilane to form silicon dioxide into a CVD reaction zone containing said substrate on which a silicon dioxide film is to be formed;
   (b) maintaining the temperature of said zone and said substrate from about 125° C. to about 325° C.;
   (c) maintaining the presence in said zone from about about 0.2 to about 4 Torr., and
   (d) passing said gases into contact with substrate while exciting said gas mixture with a plasma for a period of time sufficient to form a silicon dioxide film thereon having a refractive index of about 1.46±0.2, wherein said plasma is excited by a RF frequency of 50 KHz at a power of about 100 to about 500 Watts or by a RF frequency of 13.56 MHz at a power of about 10 to about 100 Watts.

19. The plasma CVD process of claim 18 wherein said other reactant gas is nitrous oxide or a m of nitrous oxide and nitric oxide.

20. The plasma CVD process of claim 19 wherein the flow rate of said di-tert-butylsilane into said zone is from about 75 sccm to about 200 sccm, the flow rate of said nitrous oxide is from about 300 sccm to about 3000 sccm and the flow rate of said nitric oxide is from 0 to about 2000 sccm.

21. The plasma CVD process of claim 20 wherein said zone temperature is from about 200° C. to about 300° C.

22. The plasma CVD process of claim 1 wherein said substrate is selected from the group consisting of resin objects or films, glass objects or films, metal objects or films, and semiconductor layers or devices.

23. The plasma CVD process of claim 14 wherein said substrate is selected from the group consisting of resin objects or films, glass objects or films, metal objects or films, and semiconductor layers or devices.

24. The plasma CVD process of claim 18 wherein said substrate is selected from the group consisting of resin objects or films, glass objects or films, metal objects or films, and semiconductor layers or devices.

* * * * *

UNITED STATES PATENT AND TRADEMARK OFFICE
CERTIFICATE OF CORRECTION

PATENT NO.   : 4,877,641
DATED        : October 31, 1989
INVENTOR(S)  : Thomas S. Dory It is certified that error appears in the above—identified patent and that said Letters Patent is hereby corrected as shown below:

Column 7, line 39; after the first "silicon" insert --nitride film having a refractive index--.

Column 7, line 41; delete "nitride film having a refractive index".

Signed and Sealed this

Third Day of September, 1991

Attest:

HARRY F. MANBECK, JR.

Attesting Officer     Commissioner of Patents and Trademarks

UNITED STATES PATENT AND TRADEMARK OFFICE
CERTIFICATE OF CORRECTION

PATENT NO. : 4,877,641

DATED : October 31, 1989

INVENTOR(S) : Thomas S. Dory

It is certified that error appears in the above-identified patent and that said Letters Patent is hereby corrected as shown below:

Column 3, line 23, delete "silico" and insert --silicon--.

Column 9, line 8, delete "m" and insert instead --mixture--.

Signed and Sealed this

Twenty-second Day of October, 1991

Attest:

HARRY F. MANBECK, JR.

*Attesting Officer*

*Commissioner of Patents and Trademarks*